United States Patent [19]

Chase et al.

[11] Patent Number: 4,759,466

[45] Date of Patent: Jul. 26, 1988

[54] EMI SEAM FOR ENCLOSURES

[75] Inventors: Steven B. Chase, San Jose; Roy J. Askeland, Fremont, both of Calif.

[73] Assignee: Apple Computer, Inc., Cupertino, Calif.

[21] Appl. No.: 105,398

[22] Filed: Oct. 6, 1987

Related U.S. Application Data

[63] Continuation of Ser. No. 896,511, Aug. 14, 1986.

[51] Int. Cl.[4] .............................................. H01H 9/04
[52] U.S. Cl. ................................... 220/306; 200/305
[58] Field of Search ................... 220/76, 77, 306, 307, 220/352, 353; 200/304, 305; 312/9, 10; D14/100

[56] References Cited

U.S. PATENT DOCUMENTS

4,533,805 8/1985 Fujinami et al. ................... 200/304
4,663,240 5/1987 Hajdu et al. ........................ 428/545

Primary Examiner—Stephen Marcus
Assistant Examiner—Nova Stucker
Attorney, Agent, or Firm—Blakely, Sokoloff, Taylor & Zafman

[57] ABSTRACT

An enclosure having an improved seam for inhibiting passage of electromagnetic radiation through the enclosure is described. The enclosure having a housing and a removable cover are joined at its respective edges. A plurality of spaced-apart tabs extend from an edge and slideably engage a plurality of slots which are formed on an interior surface adjacent to a corresponding mating edge. A domed projection on each tab slides into recessed cavities located on each slot to form a tight mechanical connection. The enclosure has a metal-coated interior surface and mating surface, wherein the tabs and slots operate to electrically couple the cover to the housing.

25 Claims, 9 Drawing Sheets

EMI SEAM FOR ENCLOSURES

This is a continuation of application Ser. No. 896,511 filed Aug. 14, 1986.

BACKGROUND OF THE INVENTION

1. Field of the Invention

This invention relates to the field of enclosures and more specifically, to electromagnetic interference shielding enclosures.

2. Prior Art

In the manufacture of computers and computer related equipment, enclosures are provided as containers for such devices. These enclosures come in different shapes, sizes and materials, but normally most enclosures have a removable cover. Typically, the component parts of the equipment are mounted into the base portion of an enclosure and then the cover is placed to seal the equipment within. However, where electronic and computer components, such as circuit boards, semiconductor chips, memory devices, etc., are involved, it is necessary to seal in the electromagnetic radiation generated by these internal devices, as well as protecting these devices from external electromagnetic radiation. The purpose for this isolation is to provide shielding from electromagnetic interference (EMI).

EMI shielding is provided by using an electrically conducting material which surrounds the device to be shielded. When separate sections are assembled to form an enclosure, a seam formed at the juncture of the sections must also inhibit leakage of EMI radiation. Significant leakage problems are typically encountered at this seam.

Prior art enclosures have used conducting materials such as copper, beryllium-copper, conductive rubber, etc., as seam materials. However, these materials were utilized primarily to provide a gasket to inhibit radiation leakage. Gaskets provided effective seals when enclosures were initially assembled, but lost their effectiveness as an EMI shield with repeated use. Therefore, it was recommended that these prior art gaskets be replaced each time an enclosure was opened and resealed. This requirement placed additional constraints, as well as cost, whenever such enclosures were opened for maintenance and repair.

If the gaskets were not replaced, the shielding effectiveness of the seam eroded further with each opening and closing of the enclosure. Further, prior art gaskets had a potential of being positioned improperly, thereby preventing the formation of an effective shield at the seam.

It is appreciated then, that a novel type of EMI shielding seam is needed to provide a seal for an enclosure, wherein such seal may be used repeatedly for subsequent openings.

SUMMARY OF THE INVENTION

The present invention describes an enclosure which includes a novel type of seam for inhibiting passage of electromagnetic radiation through the enclosure. The enclosure includes a housing to house electronic, computer and related equipment which must be shielded from the external environment. A removable cover is placed upon the housing to form the enclosure. The housing and cover are joined at a seam, wherein a plurality of tabs are located along one edge and a plurality of slots are located along a corresponding joining edge for accepting each of the tabs.

These tabs and slots are disposed along the joining edges to form a secure mechanical coupling. The inside of the enclosure, tabs and slots are coated with a conducting material to inhibit the passage of electromagnetic radiation. The tabs extend beyond one edge and readily slide into the slots, which are provided on an interior surface adjacent to the corresponding mating edge. Further, each of the tabs includes a raised dome on a mating surface such that the raised dome slideably slips into a recess formed in the respective mating slot. The tabs and slots, in essence, form a switch to close an electrical connection between the housing and the cover, wherein the tabs and slots provide a seam which also seals electromagnetic radiation.

DETAILED DESCRIPTION OF THE PRESENT INVENTION

The present invention discloses an enclosure having an improved seam which inhibits the passage of electromagnetic radiation. In the following description, numerous specific details are set forth in such specific shape, dimensions, etc., in order to provide a thorough understanding of the present invention. It will be obvious, however, to one skilled in the art that the present invention may be practiced without these specific details. In other instances, well-known structures have not been described in detail in order not to unnecessarily obscure the present invention.

Referring to FIGS. 1-9, an enclosure 10 having a housing 11 and a cover 12 is shown. Housing 11 includes a rear wall 13, front wall 14, and side wall 15 attached to base 16. Ribs 17 are formed along an interior surface of base 16 and walls 13-15 to provide structural support of housing 11, although such ribs 17 are not necessary to practice the present invention. The preferred embodiment has rear wall 13 at a height above other walls 14 and 15, however, such height of any wall being discretionary.

Cover 12 is constructed to fit over an opening 18 of housing 11 so as to provide an enclosed container. Cover 12 includes a rear wall 20, front wall 21 and side walls 22 attached to top 23, such that the walls 20-22 mate to walls 13-15, respectively. Ribs 24 are formed along an interior surface of cover 12 to provide structural support, but again, such ribs 24 are not necessary to practice the present invention. Further, the preferred embodiment has a rear wall 20 at a shorter height than the other walls 21 and 22 so that rear wall 20 will mate with rear wall 13. Again, such height is discretionary and is not critical to the practice of the present invention.

Figure 1:
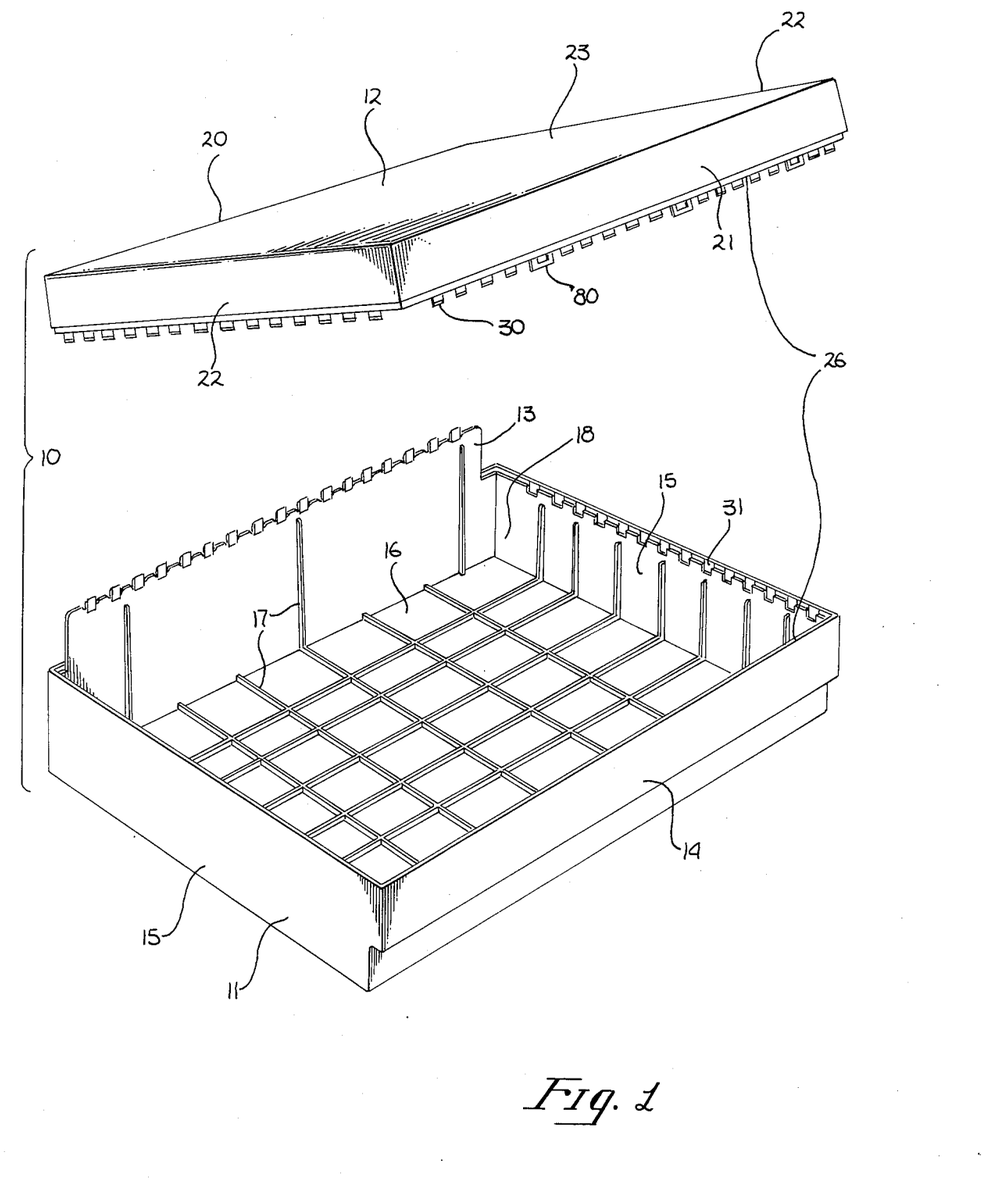
FIG. 1 is a pictorial view of an enclosure showing a base housing and removable cover.
Figure 2:
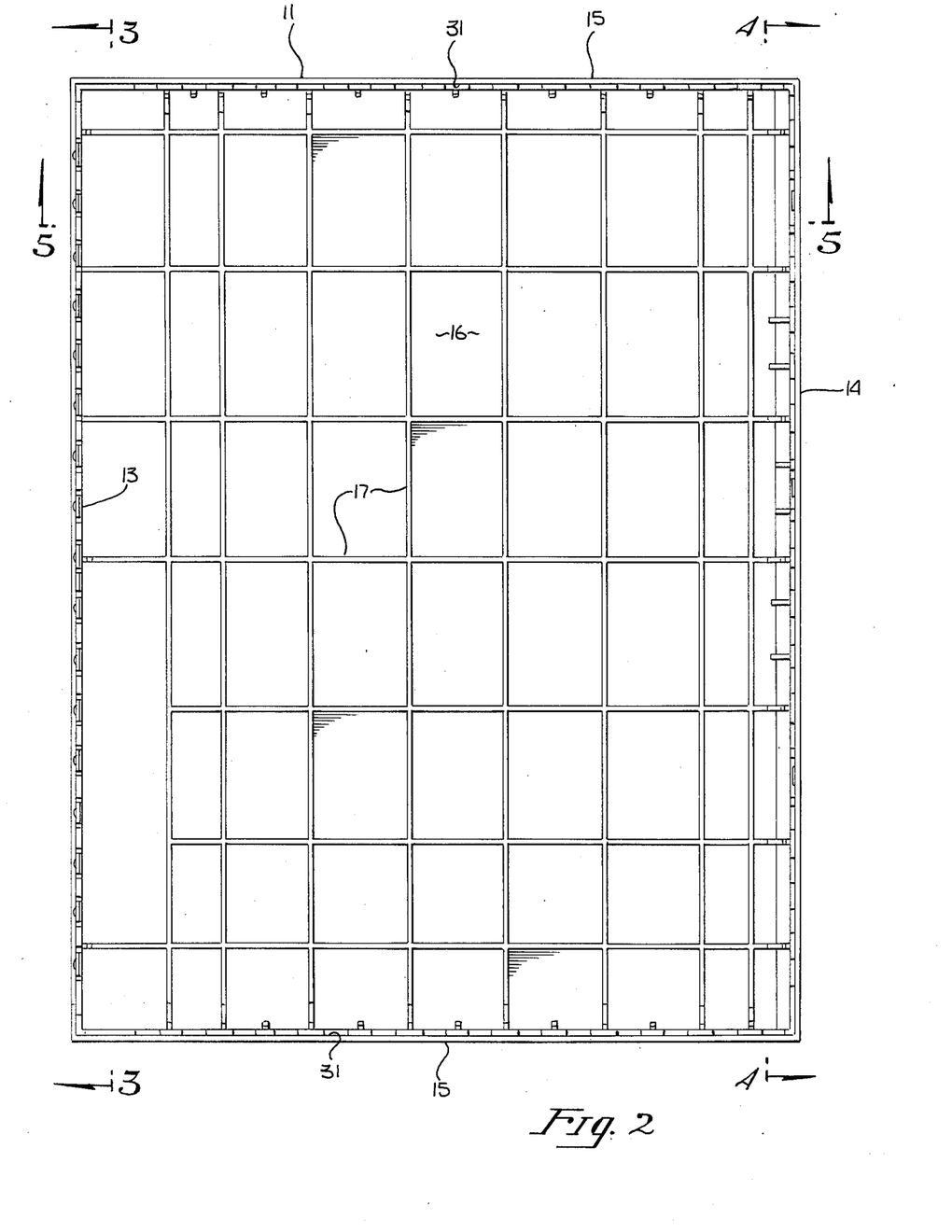
FIG. 2 is an elevation view of the housing of FIG. 1.
Figure 3:
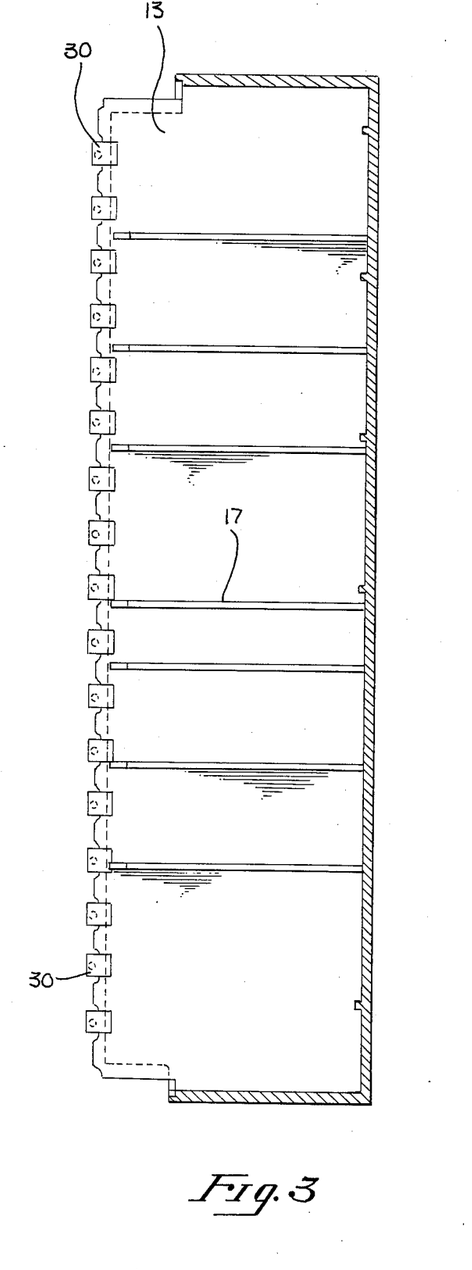
FIG. 3 is a plan view of a back wall taken along line 3—3 of FIG. 2.
Figure 4:
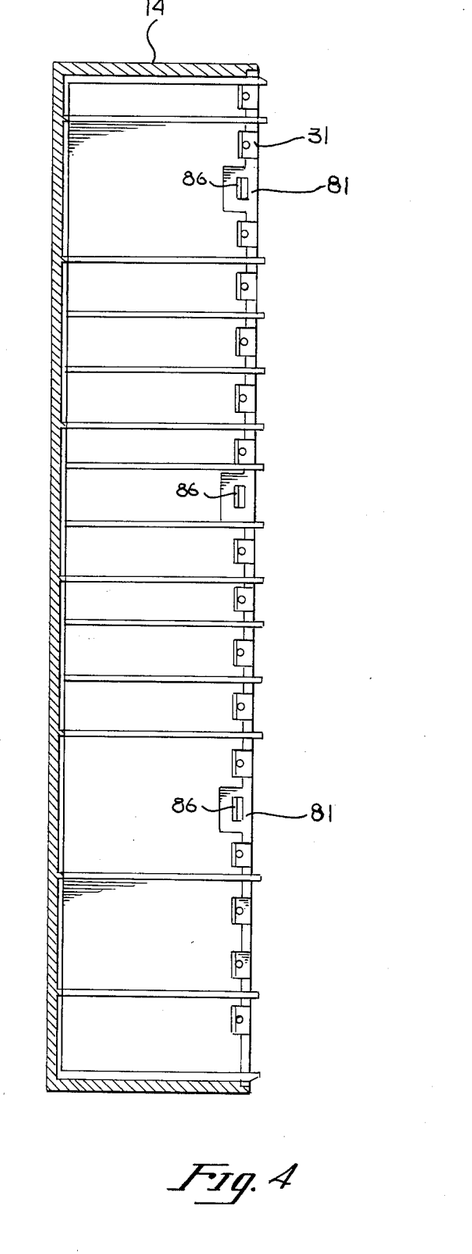
FIG. 4 is a plan view of a front wall taken along line 4—4 of FIG. 2.
Figure 5:
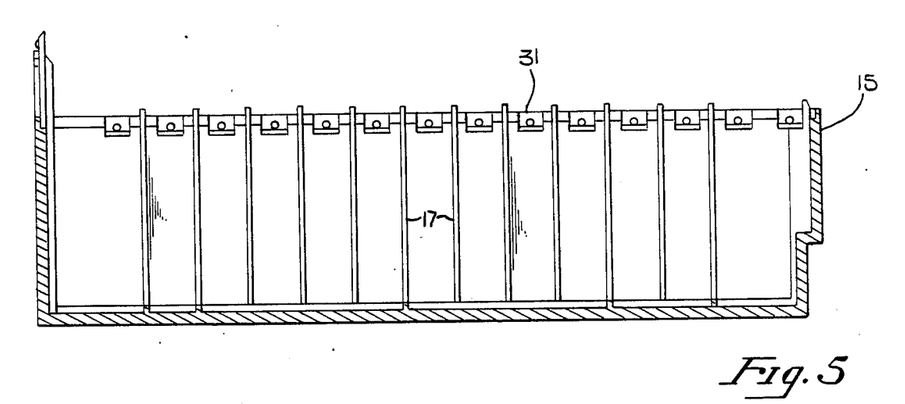
FIG. 5 is a plan view of a side wall taken along line 5—5 of FIG. 2.
Figure 6:
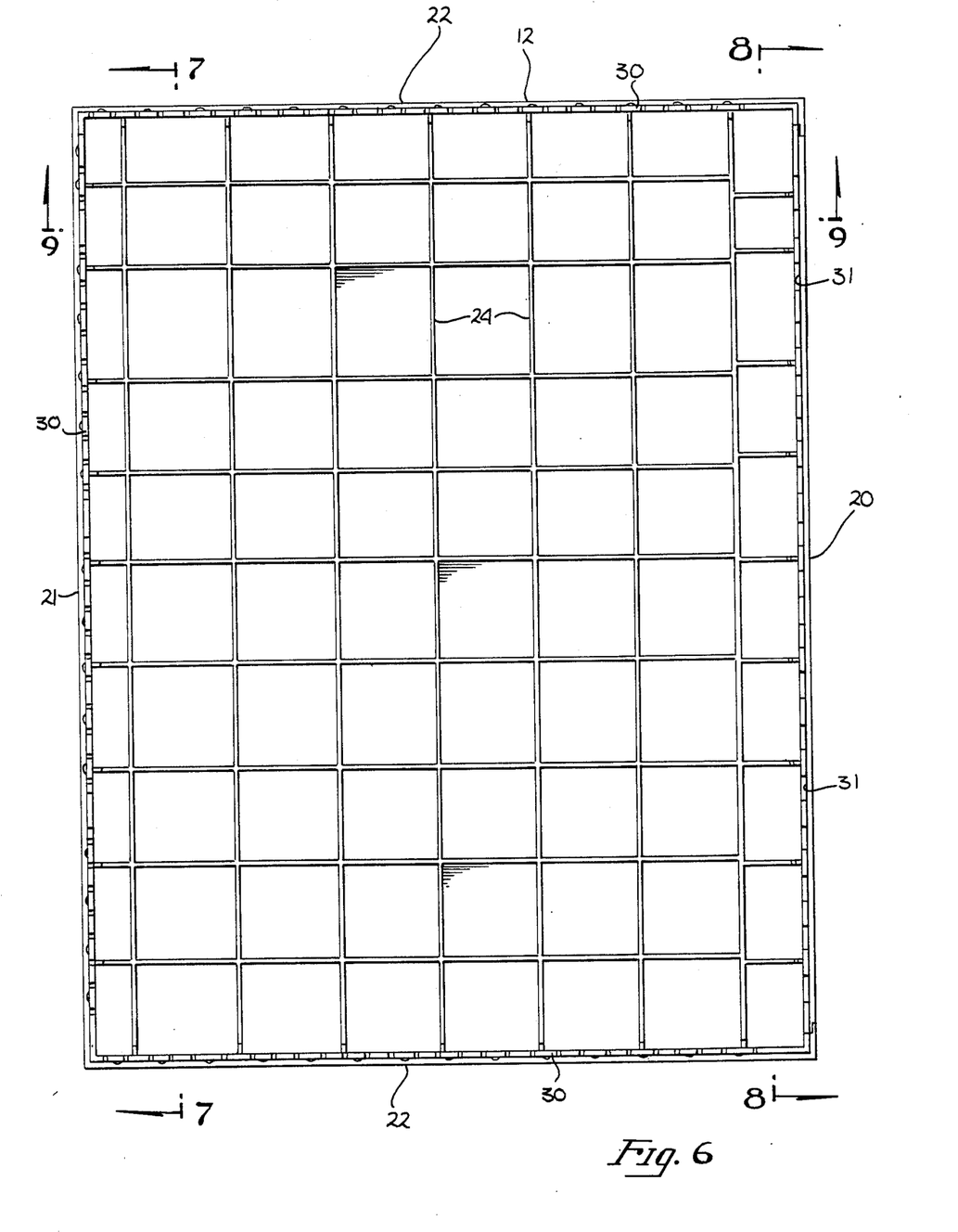
FIG. 6 is an elevation view of the cover of FIG. 1.
Figure 7:
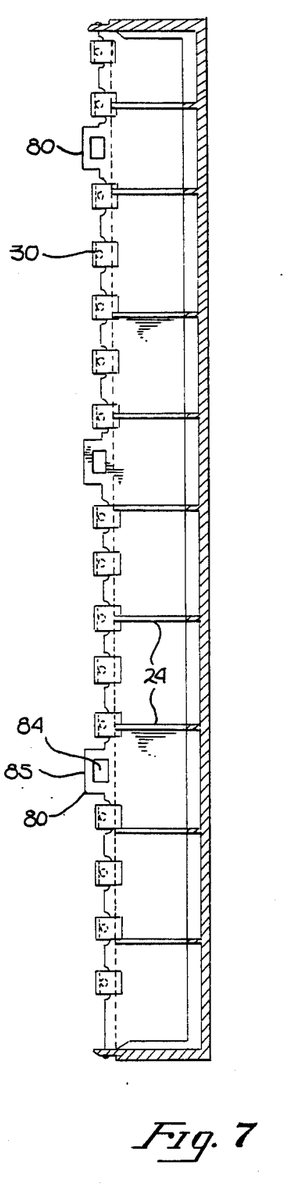
FIG. 7 is a plan view of a front wall taken along line 7—7 of FIG. 6.
Figure 8:
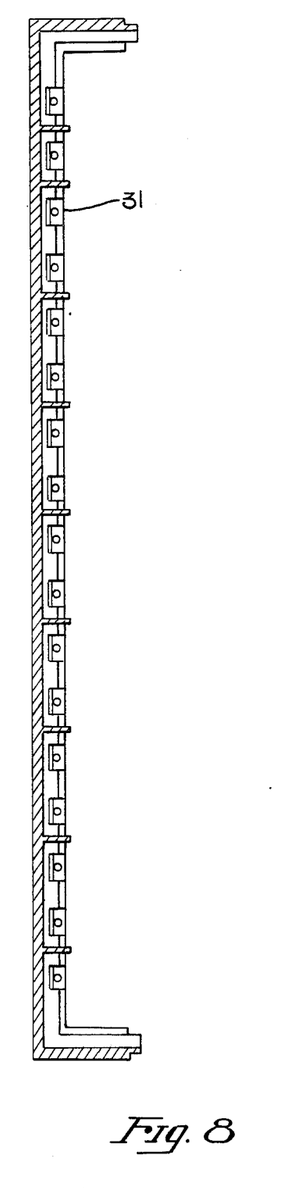
FIG. 8 is a plan view of a back wall taken along line 8—8 of FIG. 6.
Figure 9:
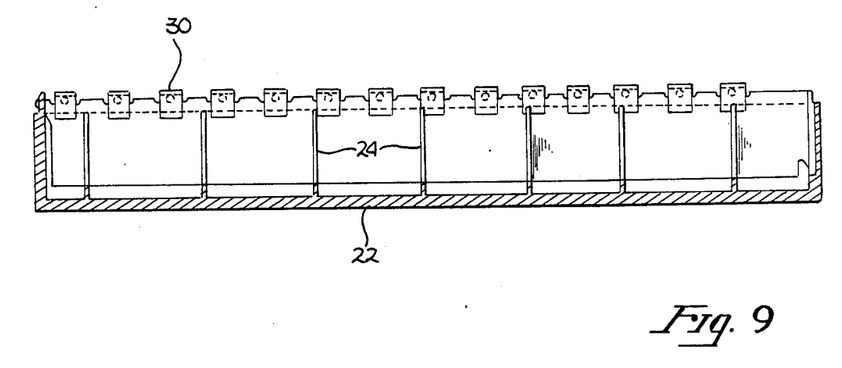
FIG. 9 is a plan view of a side wall taken along line 9—9 of FIG. 6.

The housing 11 is constructed from molded plastic having a unibodied design. The cover 12 is also constructed of a molded plastic, unibodied design, although most any plastic material may be used for housing 11 and cover 12. The interior surfaces and mating surfaces of enclosure 10 are coated by a layer of aluminum. The coating, approximately 2½ to 5 micron layer of aluminum, is deposited by a vacuum metallization process, however, any of several conductive materials may be deposited by a variety of processes well-known in the prior art. The aluminum coating functions as a conducting shield against EMI.

Seam 26, formed by the joining of housing 11 and cover 12, provides for a continuous shield by joining the respective walls of cover 12 and housing 11. Along edges of the various walls 21, 22 and 13 are disposed a plurality of tabs 30. These tabs 30 extend beyond the edge of the walls 21, 22 and 13. Along the corresponding mating walls 14, 15 and 20, a plurality of slots 31 have been disposed to accept the tabs 30. Although walls 21, 22 and 13 have tabs 30, while walls 14, 15 and 20 have slots 31, such arrangement is purely arbitrary as long as each joining pair of walls maintain a seam 26 which includes the combination of tabs 30 and slots 31 to provide the coupling.

Figure 10:
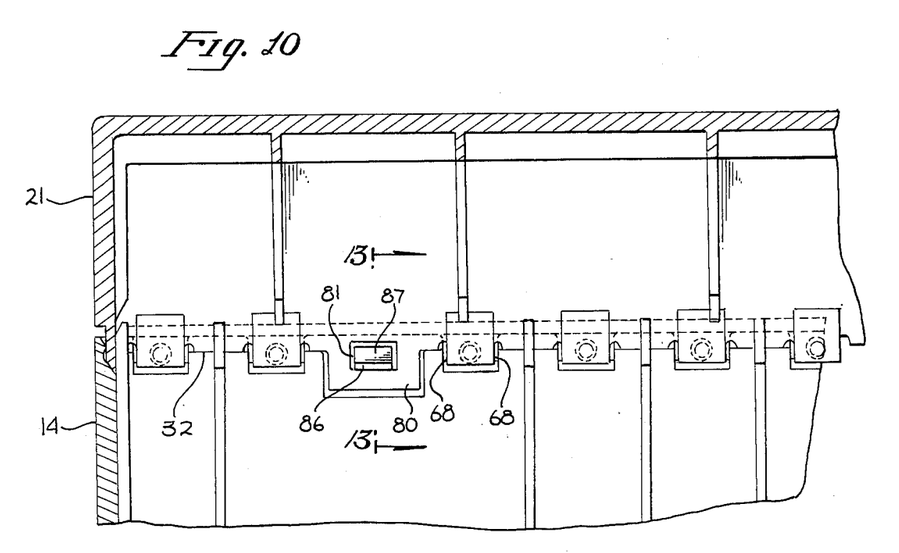
FIG. 10 is an expanded plan view of the front wall of the housing and cover showing the formation of a seam.
Figure 11:
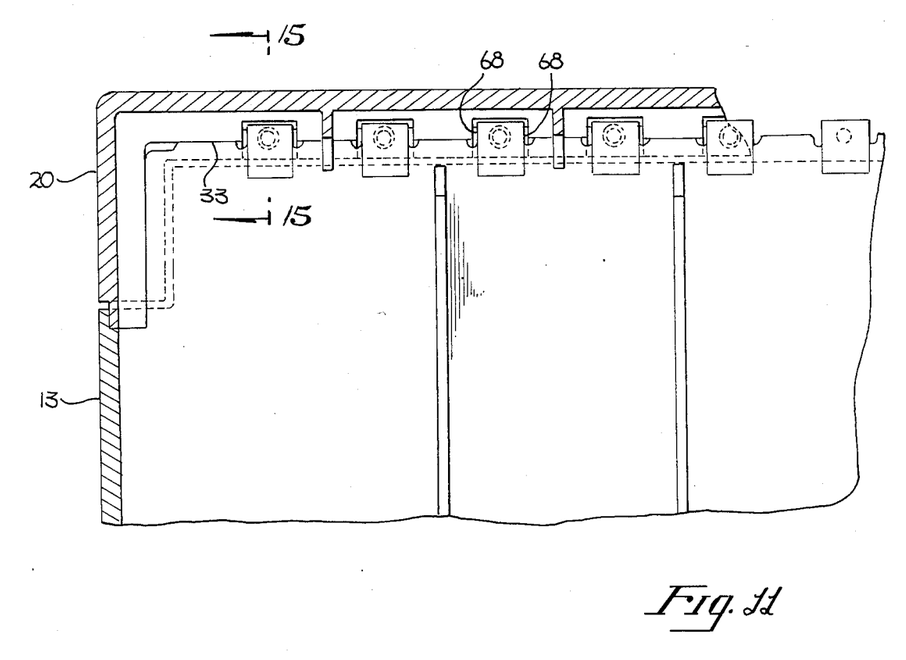
FIG. 11 is an expanded plan view of the back wall of the housing and cover showing the formation of a seam.

Referring to FIGS. 10 and 11, FIG. 10 shows a seam 32 formed by joining front walls 14 and 21 and FIG. 11 shows a seam 33 formed by joining back walls 13 and 20. Although in FIG. 10 tabs 30 are disposed on cover 21 and in FIG. 11, tabs 30 are disposed on housing 11, the formation of seams 32 and 33 by coupling tabs 30 to slots 31 is equivalent in function as stated earlier.

Referring to FIGS. 14-19, a more descriptive illustration of a single tab 30 and its corresponding mating slot 31 is shown. Each tab 30 is comprised of a flat extended member 41 and a raised dome 42. Member 41 is an extension of an interior surface 36 of wall 38 rising beyond edge 35. However, where wall 38 has a casing thickness 43, extended member 41 has a thickness 45 which is less than thickness 43 due to an indentation 44. Member 41 extends along interior wall 36 such that indentation 44 faces exterior surface 37. A distal end 47 of member 41 is terminated by a bevel 48, which has a slanted surface, wherein bevel 48 has en elongated projection 46 which is adjacent to the interior surface 36.

Member 41 also has a shortened surface 50 adjacent to indentation 44.

Dome 42 is located upon surface 50 proximate to the distal end 47 and facing indentation 44. Dome 42 is circular in shape and rises from surface 50 in a convex fashion. Dome 42 having a radius 54 is centered along width 52 and the circumference 49 making contact with bevel 48. Dome 42 and surface 50, facing toward the exterior, form the mating surface and are coated by a layer of aluminum.

Figure 18:
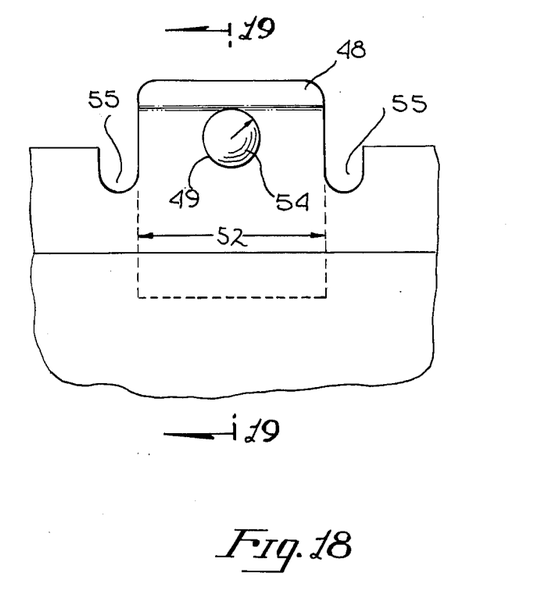
FIG. 18 is a plan view of the tab of FIG. 15.
Figure 19:
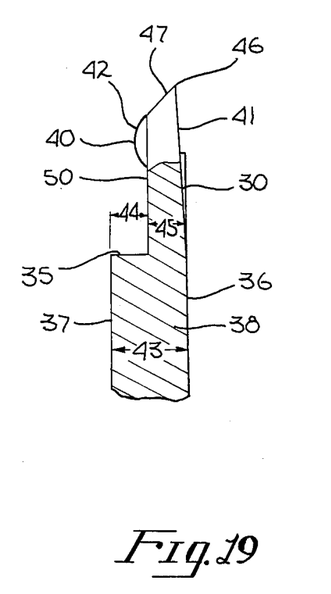
FIG. 19 is another plan view of the tab of FIG. 15 taken along line 19—19 of FIG. 18.

Tab 30 is constructed from a unitary piece of material forming wall 38. Member 41 of tab 30 is molded so that a slight angular lean toward exterior surface 37 exists. Further, tab 30 is partly separated from adjacent areas of the wall 38 by semi-oval shaped cutouts 55, one on each side of tab 30. The cutouts 55 are present to better delineate the tabs 30 and to reduce the shearing force on tabs 30, although the present invention may be practiced without such cutouts 55.

Figures 12, 13, 14, 15:
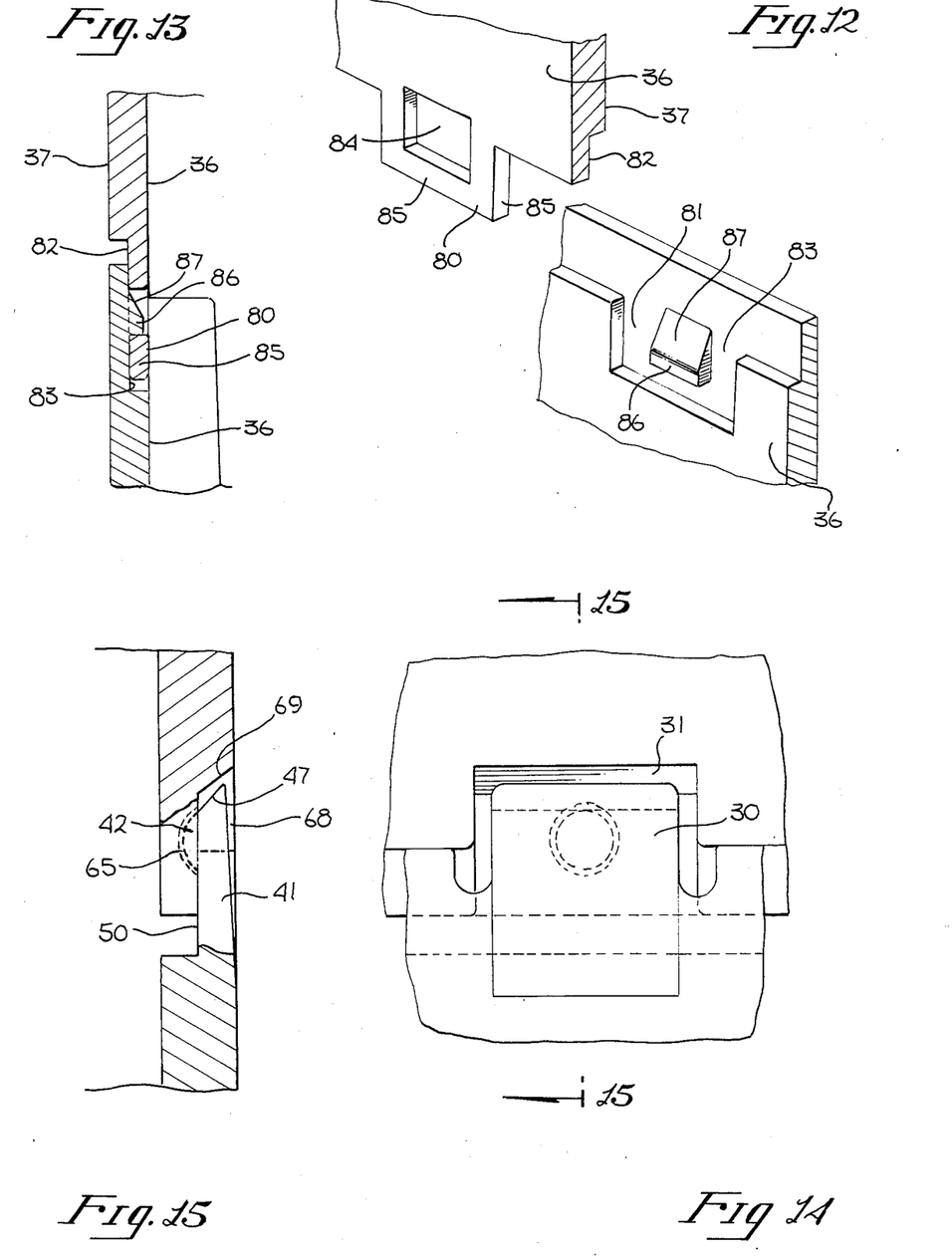
FIG. 12 is an expanded pictorial view of a guide for joining the cover and housing of FIG. 1.
FIG. 13 is a plan view of the guide taken along line 13—13 of FIG. 10.
FIG. 14 is an expanded plan view of a tab and slot for accepting the tab which forms the seam when the cover and housing of FIG. 1 are joined together.
FIG. 15 is a plan view of the tab and slot when taken along line 15—15 of FIGS. 11 and 14.
Figures 16, 17:
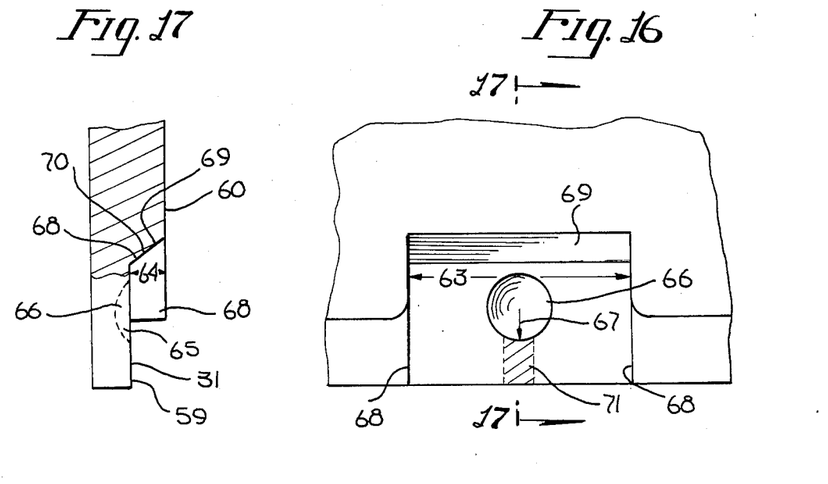
FIG. 16 is a plan view of the slot of FIG. 15.
FIG. 17 is another plan view of the slot taken along line 17—17 of FIG. 16.

A slot 31 is formed upon an interior surface 60 of a joining edge to tab 30. Slot 31 is formed when during a molding process, an indentation 64 is patterned. Indentation 64 causes slot surface 59 to form parallel to interior surface 60, but disposed at a distance from the interior surface 60, such distance being the depth of indentation 64. Disposed on slot surface 59 is a cavity 65 having a depth 66, the recess opening facing slot surface 69. Cavity 65 has a radius 67, which is slighlty larger than radius 54 of dome 42. The depth 66 is slightly larger than the height of dome 42 such that dome 42 will readily fit into cavity 65. Further, cavity 65 is located midway between width 63 of slot 31. A proximal end 70 has a slanted surface 69 to accommodate bevel 48 of tab 30.

In operation, tab 30 slides across slot 31 until dome 42 is disposed within cavity 65, such that the depth 66 accommodates dome 42 and bevel 48 projects toward slanted surface 69. Dome 42, as it slides, touches a portion of slot surface 59, such portion being shown by shaded area 71. The tab 31, because of its slight angular lean towards slot surface 59 provides for added force when tab 30 and slot 31 are mated; yet tab 31 is flexible to permit bending of member 41 to relieve stress during the coupling procedure. The angular lean causes tabs 30 to direct a force against slots 31, such that a tight mechanical coupling is achieved.

The only contact points between tab 30 and slot 31 occur on the tip 40 of dome 42 and area 71 of slot 31 until dome 42 is properly seated within cavity 65. Therefore, during the coupling procedure, the only place where friction will remove the surface coating is restricted to the tip 40 of dome 42 and area 71. Once seated, the flexing of tab 30 forces dome 42 to fit within cavity 65. The only area where coating may have been removed due to friction is restricted to tip 40 of dome 42 and area 71. However, tip 40 is covered by the conductive coating of cavity 65 and area 71 is covered by the coating on surface 50 once tab 30 is mated to slot 31. Hence, all areas where coating could have been removed from the coupling operation is mated by surfaces having such coatings in place, such that dome 42 is securely circumscribed by the coated conductive surfaces.

Wall area 68 located adjacent to slot 31 provides a guide for each tab 30 to slide vertically into each slot 31 without any side motion. However, to further assist the alignment of the cover 12 onto housing 11, front wall 21 of cover 12 includes guide tabs 80 as shown in FIG. 1.

The preferred embodiment has three such guide tabs disposed uniformly apart, wherein each guide tab 80 replaces one of the earlier described tabs 30.

Referring to FIGS. 4, 7, 10, 12 and 13, the guide tabs 80 and corresponding slots 81 for accepting guide tabs 80 are shown. The construction of guide tabs 80 and slots 81 are substantially equivalent to that of tabs 30 and slots 31. Each guide tab 80 is formed along interior wall 36, having an indentation 82 facing exterior surface 37 and each slot 81 having corresponding mating surface 83 to accept guide tab 80.

Each guide tab 80 includes an opening 84 and outer frame 85. Tab 80 slides into slot 81, until a projection 86 which is formed on surface 83 snaps into opening 84. The preferred embdodiment has rectangular opening 84 and a corresponding rectangular shaped projection 86. Projection 86 also has a slanted surface 87 which allows easier mating of opening 84 and projection 86.

In operation, the guide tabs 80, because of their extended length, are used for initial alignment of wall 21 to wall 14. Once aligned by this initial process, the tabs 30 will then be engaged to the walls to form the enclosure 10. Note that guide tabs 80 are provided in the preferred embodiment to ease the closing procedure of cover 12 onto housing 11 and is not necessary for practicing the invention.

To open the enclosure 10, a slight mechanical force is used to raise the dome 42 from the cavity 65 and tab 30 is slideably removed in a motion opposite to that of insertion as described earlier. Again, only tip 40 of dome 42 and area 71 are affected. Therefore, even if tip 40 and area 71 become devoid of coating from repeated friction, it does not affect the shielding property of the enclosure 10. In electronics representation, the tabs 30 and slots 31 operate as a closing and opening of an electronic switch; wherein tabs 30 and slots 31 function to electrically couple the conducting surfaces of housing 11 and cover 12 when dome 42 mates with cavity 65. It has been found that the best performance is achieved when tabs 30 are spaced less than one inch apart along the various walls.

Thus, an improved seam for an enclosure which inhibits the passage of electromagnetic radiation has been described.

What is claimed is:

1. An enclosure for inhibiting passage of electromagnetic radiation comprising:
    a first housing member having a coating which inhibits passage of electromagnetic radiation;
    a second housing member having a coating which inhibits passage of electromagnetic radiation;
    coupling means for joining said two housing members, said coupling means comprised of a plurality of extended tabs disposed on said first housing member and said second housing member having a plurality of slots for accepting said tabs, each tab fitting into a corresponding slot to form a tab-slot mating pair,
    wherein each of said tab-slot mating pairs includes a raised dome on one of said tab-slot mating pair and a recessed cavity on other of said corresponding tab-slot mating pair, such that said raised dome slideably engages with said recessed cavity;
    said coupling means providing an effective seam when said two housing members are joined;
    whereby said enclosure is formed.

2. The enclosure of claim 1, wherein said tabs and slots are spaced apart along joining edges of said housing members.

3. The enclosure of claim 2, wherein interior surfaces and mating surfaces of said enclosure are coated with a conducting material, such that said coupling means functions as an electrical switch between said housing members.

4. The enclosure of claim 3 wherein said tabs have a beveled end to allow easier entry of said tabs into said slots.

5. The enclosure of claim 4, wherein said tabs are disposed along said interior surface of said enclosure.

6. The enclosure of claim 5 wherein said enclosure is constructed from a plastic material and said conducting material is metallic.

7. The enclosure of claim 6, wherein said enclosure is used to confine a computer device therein.

8. A computer enclosure for inhibiting emanation of electromagnetic radiation comprising:
    a housing having a base, side walls and a plurality of spaced apart slots along at least one of said side walls:
    a removable cover having a plurality of extended tabs disposed thereon;
    wherein each of said tabs further includes a raised dome disposed on a surface facing said slots and said housing further includes a recessed cavity within each of said slots, such that said domes slideably engage said slots and mate with said cavity such that said slots attach said cover to said housing;
    said housing and cover having a coating which inhibits passage of electromagnetic radiation;
    whereby an effective seam is provided to inhibit emanation of electromagnetic radiation from said enclosure.

9. The enclosure of claim 8, wherein said tabs are formed along an interior surface of said cover and said slots are formed as indentations to interior surface of said housing.

10. The enclosure of claim 9, wherein said interior and mating surfaces of said cover and housing are coated with a conducting material, such that said tabs and slots function as a switch electrically coupling said interior conducting surfaces of said cover and housing.

11. The enclosure of claim 10, wherein said tabs are formed as a unibodied extension of said cover.

12. The enclosure of claim 11, wherein said cover and housing are constructed from a plastic material.

13. The enclosure of claim 12 wherein said tabs have a beveled end to allow easier entry for said tabs into said slots.

14. The enclosure of claim 13, wherein some of said tabs have extended projections to function as guides during initial stages of attaching said cover.

15. The enclosure of claim 14, wherein said coating is a layer of aluminum of approximately 2.5–5.0 microns thick.

16. The enclosure of claim 15, wherein said enclosure is used as a computer casing.

17. The enclosure of claim 13, wherein said housing has a plurality of said tabs disposed along at least one of said sidewalls and a plurality of slots disposed along a corresponding mating sidewall of said cover.

18. A computer enclosure for inhibiting emanation of electromagnetic radiation comprising:

a housing having a base, sidewalls and an upper opening, said housing having a plurality of spaced-apart slots formed into an interior surface of said housing and disposed adjacent to said opening;

a removable cover having a top surface and joining edges to mate to said side walls of said housing, said cover having a plurality of extended tabs disposed thereon, said tabs slideably engaging said slots to attach said cover to said housing;

wherein each of said tabs includes a convex dome disposed on said flat surface of said tab facing its corresponding slot and said housing further including a concave cavity disposed within each of said slots, such that said domes slideably engage said slots and mate with said cavity;

a conductive coating disposed on interior surfaces of said cover and said housing, and said mating surfaces of said tabs and slots;

whereby an effective seam to seal said enclosure is achieved.

19. The computer enclosure of claim 18, wherein said tabs are indented from an outer surface of said cover.

20. The computer enclosure of claim 19, wherein said cover and housing are molded from a plastic material, and said tabs are molded as unibodied extensions of said cover.

21. The computer enclosure of claim 20 wherein said conductive coating is metallic and said tabs and slots function as a switch electrically coupling said interior conducting surfaces of said cover and housing.

22. The computer enclosure of claim 21 wherein said tabs have a beveled end to allow easier entry of said tabs into said slots.

23. The computer enclosure of claim 22, wherein some of said tabs have extended projections to function as guides during initial stages of attaching said cover.

24. The computer enclosure of claim 23, wherein said enclosure and cover are rectangular in shape.

25. The computer enclosure of claim 24, wherein said housing has a plurality of said tabs disposed along at least one of said sidewalls and a plurality of slots disposed along a corresponding mating sidewall of said cover.

* * * * *